(12) United States Patent
Yamazaki

(10) Patent No.: US 8,004,037 B2
(45) Date of Patent: Aug. 23, 2011

(54) MOS TYPE SEMICONDUCTOR DEVICE

(75) Inventor: Tomoyuki Yamazaki, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 61 days.

(21) Appl. No.: 12/479,353

(22) Filed: Jun. 5, 2009

(65) Prior Publication Data
US 2009/0302346 A1 Dec. 10, 2009

(30) Foreign Application Priority Data

Jun. 5, 2008 (JP) .................................. 2008-147714

(51) Int. Cl.
*H01L 29/68* (2006.01)
(52) U.S. Cl. ................. 257/329; 257/E29.197
(58) Field of Classification Search .................. 257/329, 257/330, E29.197, E29.198, E29.257, E29.262
See application file for complete search history.

(56) References Cited

U.S. PATENT DOCUMENTS

| | | | |
|---|---|---|---|
| 5,329,142 A | 7/1994 | Kitagawa et al. | |
| 5,448,083 A | 9/1995 | Kitagawa et al. | |
| 5,585,651 A | 12/1996 | Kitagawa et al. | |
| 5,689,121 A | 11/1997 | Kitagawa et al. | |
| 5,838,026 A | 11/1998 | Kitagawa et al. | |
| 6,262,470 B1 * | 7/2001 | Lee et al. | 257/565 |
| 7,056,779 B2 * | 6/2006 | Hattori | 438/197 |
| 2006/0081919 A1 * | 4/2006 | Inoue et al. | 257/330 |

FOREIGN PATENT DOCUMENTS

| | | |
|---|---|---|
| EP | 0 538 004 A2 | 4/1993 |
| JP | 5-110085 A | 4/1993 |
| JP | 7-135309 A | 5/1995 |

OTHER PUBLICATIONS

H.Yilmaz; "Cell Geometry Effect on IGT Latch-UP", IEEE Electron Device Letters, vol. EDL-6, No. 8, Aug. 1985, pp. 419-421.

\* cited by examiner

*Primary Examiner* — Benjamin P Sandvik
*Assistant Examiner* — W. Wendy Kuo
(74) *Attorney, Agent, or Firm* — Rossi, Kimms & McDowell LLP

(57) ABSTRACT

A surface between gate electrodes in an MOS gate structure is patterned so that missing portions are partially provided in surfaces of $n^+$ emitter regions to thereby enlarge surface areas of $p^+$ contact regions surrounded by the surfaces of the $n^+$ emitter regions. In this manner, a highly reliable MOS type semiconductor device is provided which is improved in breakdown tolerance by suppressing an increase in the gain of a parasitic transistor caused by photo pattern defects produced easily in accordance with minute patterning in a process design rule.

11 Claims, 6 Drawing Sheets

FIG. 1A
FIG. 1C
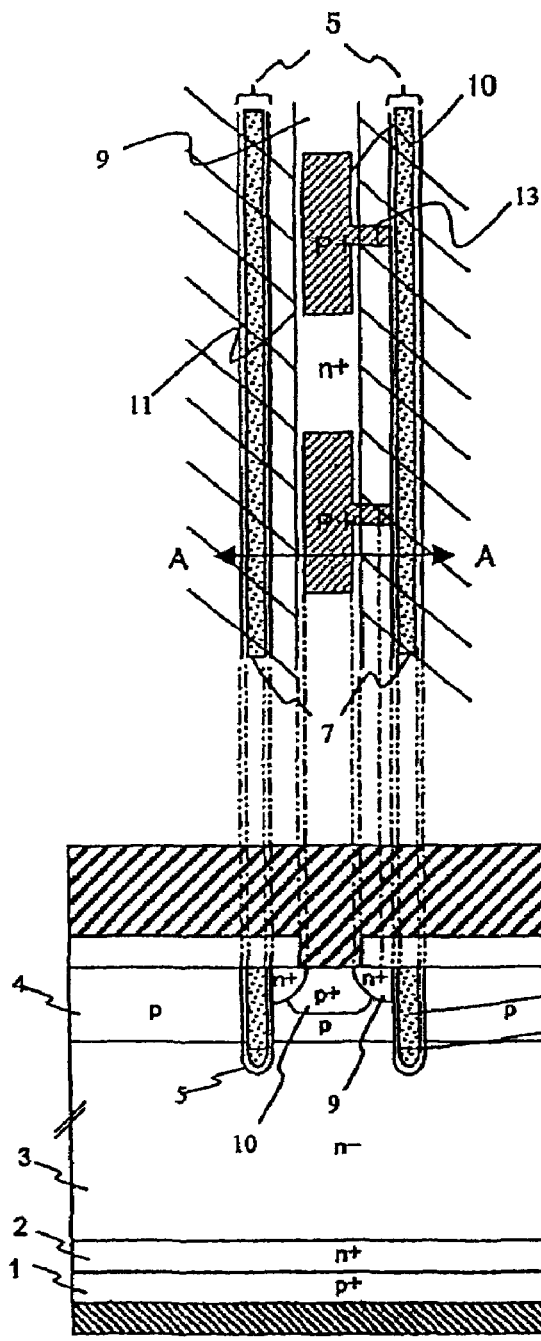
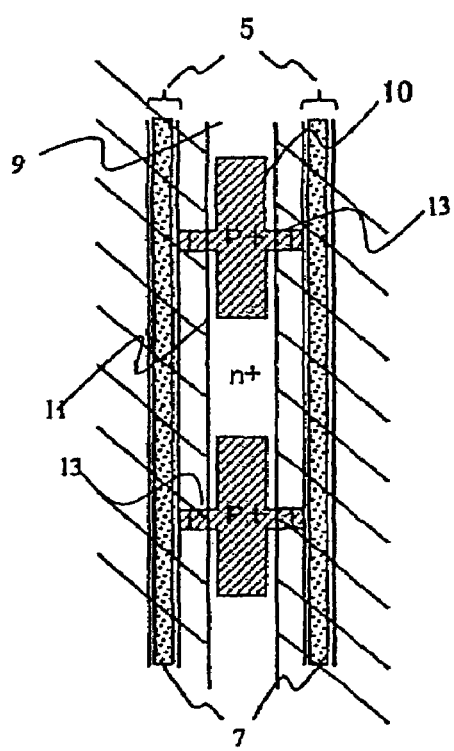
FIG. 1B

MOS TYPE SEMICONDUCTOR DEVICE

BACKGROUND

The present invention relates to an MOS type semiconductor device such as an IGBT (Insulated Gate Bipolar Transistor), a power MOSFET (Metal Oxide Semiconductor Field Effect Transistor), etc. used as a switching device for power conversion.

Power conversion apparatuses, such as inverter apparatuses, have been applied to various fields in recent years, because there is an accelerated demand for the power conversion apparatuses with advances that meet energy savings requirements due to environmental issues. Application of such power conversion apparatuses has recently advanced to fields particularly requiring high reliability such as electric railroad vehicle engineering, automobile engineering, aeronautical engineering and space engineering. It is a matter of course that a power device used as the key component of this type power conversion apparatus needs to have very high reliability under such circumstances.

On the other hand, it is definitely not easy to produce a faultless and highly reliable device while thoroughly eliminating the influence of minute foreign matter such as outside particles (dirt), particles or dust generated in a production facility, etc. as causes of various device failures and defects in a process of producing a semiconductor device including a power device. It is technically possible to reduce the device failures and defects by improving the cleanliness level of the producing process. Measures to improve the cleanness level, however, are expensive in terms of cost effectiveness.

It is said that a more realistic method to keep a balance between the product cost and the product quality (i.e. to suppress the product cost but not to lower the product quality) is a producing method which permits foreign particles up to a certain degree and which abnormal products consequently produced are screened out in shipping inspection. With respect to the screening, it is easy to discovery defective products and screen out the defective products as rejected products during shipping inspection when the defective products have initial defects exhibiting an abnormal distribution of electric characteristics, etc. There is, however, a possibility that normal products will be damaged or destroyed to reduce the percentage of non-defective products when products are tested for dynamic characteristics, especially, electric characteristics related to device breakdown tolerance. Hence, there is a problem that it is difficult to use the examination of dynamic characteristics as a test item for screening the whole number of products. As a result, there is a possibility that products of low breakdown tolerance will be shipped out.

Typical types of power devices used in such power conversion apparatuses are an IGBT and a power MOSFET. It is known that a typical factor determining the device destruction tolerance of this type device lies in the amplifying function of a parasitic transistor in an MOS structure portion of this type device. For this reason, an IGBT or MOSFET having an n-channel MOS structure is generally designed so that the gain of the parasitic npn transistor is reduced by improvement of a surface pattern or a diffusion profile to make the parasitic npn transistor inactive in an ordinary operation of the IGBT or MOSFET. For example, it is common that a front surface of a p base region is covered with a metal electrode provided in common with an $n^+$ emitter (or $n^+$ source) region to thereby form a short-circuited structure to reduce the gain of the parasitic npn transistor. However, when there is some defect (for example, pattern defect) to increase the gain of the parasitic transistor, the parasitic transistor may be turned on because the potential of the base region of the parasitic transistor increases as an overcurrent flows through the device. If the parasitic transistor is once turned on, there arises a problem that device destruction is brought about by positive feedback in which a temperature rise caused by the current concentrated in the parasitic transistor causes a further current concentration.

This issue will be described specifically based on the background art. FIG. 3A is a plan view showing important part of a trench gate type MOS structure portion of a trench gate type IGBT according to the background art. FIG. 3B is a sectional view taken along the line B-B in FIG. 3A which is a plan view showing the important part. FIG. 3C is a sectional view taken along the line C-C in FIG. 3A. In FIG. 3A which is a plan view showing the important part, a surface electrode pattern of an upper layer is not shown but an interlayer insulating film pattern of a lower layer and a pattern of a further lower layer are shown transparently. In FIG. 3B, a p base region 4 and trenches 5 having a depth extending from a front surface of a substrate to reach an $n^-$ drift layer 3 via the p base region 4 are shown on a front surface side of the $n^-$ drift layer 3 having an $n^+$ buffer layer 2, a $p^+$ collector layer 1 and a collector electrode 12 on its back surface side. In the following description in this specification, the same term 'semiconductor substrate' or 'substrate' is used for expressing the substrate as a whole even when the structure of the substrate changes successively in a process of forming functional regions successively on front and back surface sides of the semiconductor substrate input to the process.

The trenches 5 are formed as a pattern of stripes in a surface in the active region where a main current of the trench gate type IGBT flows. In a surface between the striped trenches 5 as a portion where an emitter electrode 8 which will be formed by a post process so as to come into contact with the substrate surface, there are provided an $n^+$ emitter region 9 disposed along the striped trenches 5 so as to be brought into contact with the striped trenches 5 and a $p^+$ contact region 10 formed in parallel to the striped trenches 5 and between the striped trenches 5. As shown in FIGS. 3B and 3C, the $n^+$ emitter region 9, the p base region 4 and the $n^-$ drift layer 3 are exposed in a side wall of each trench 5 and each trench 5 is filled with a gate electrode 7 through a gate insulating film 6 formed on the inner surface of the trench 5. When a predetermined gate voltage is applied to each gate electrode 7 under a forward bias between the collector electrode 12 and the emitter electrode 8, an n channel is formed in a surface of the p base region 4 along a side wall of each trench 5 so that a main current flows.

On the other hand, as shown in FIG. 3A, an interlayer insulating film 11 made of BPSG (Boro Phosphor Silicate Glass) or the like is formed on the principal surface side of the semiconductor substrate and an opening is formed in a portion of the interlayer insulating film 11 corresponding to the surface of the $n^+$ emitter region 9 and the surface of the $p^+$ contact region 10 so that the emitter electrode 8 can be brought into contact with the surface of the $n^+$ emitter region 9 and the surface of the $p^+$ contact region 10 as described above. Generally, when a surface pattern in an MOS type power device is formed finely to increase channel density, on-resistance can be reduced to attain improvement of performance. With respect to the degree of fineness to satisfy the performance, it is generally necessary that the width of the opening region of the interlayer insulating film 11 opened to bring the emitter electrode 8 into contact with the surface of the $n^+$ emitter region 9 and the surface of the $p^+$ contact region 10 between the trenches 5 (i.e. the width of the opening region between the trenches 5) is not larger than 1 μm. In this case, the width between the trenches is not larger than about 3 µm. When the width of the contact region between the emitter electrode 8 and the substrate surface is narrow to be not larger than about 1 µm as described above, a method of shaping a surface pattern of the n⁺ emitter region like a ladder as shown in FIG. 3A without provision of the n⁺ emitter region 9 and the p⁺ contact region 10 by subdividing the width of 1 µm is preferably performed in practice to bring the emitter electrode 8 into contact with both the surface of the n⁺ emitter region 9 and the surface of the p⁺ contact region 10 stably and surely in consideration of pattern alignment accuracy.

Although the trench gate type IGBT is used in the above description about the surface pattern of the n⁺ emitter region, the same rule applies to a planar gate type IGBT as shown in FIGS. 5A to 5C. With respect to the fineness of the structure, it is necessary to short-circuit the n⁺ emitter region 9 to the p⁺ contact region 10 (p base region 4) by the surface of the minute contact region in the same manner as in the trench gate type IGBT. The same rule applies not only to the IGBT but also to a power MOSFET.

When the surface pattern is made finer as shown in the case where the width between the trenches 5 is not larger than about 3 µm as described above, shaping the surface pattern of the n⁺ emitter region like a ladder permits the width to be used partially most effectively though the width is small. However, the p⁺ contact region does not particularly change from the background art even when the surface pattern of the n⁺ emitter region is shaped like a ladder. Accordingly, the width of the resist decreases as the width of the pattern in the p⁺ contact region decreases. There is a problem that when adhesive force of the resist is reduced for some reason, the possibility of pattern missing in the p⁺ contact region will become higher than that in the n⁺ emitter region. This reason is as follows. When pattern missing occurs in the p⁺ contact region, contact resistance with the p base region increases partially so that base resistance is apt to increase. Accordingly, the parasitic npn transistor is operated by conduction of a current smaller than the original current value, so that the risk of device breakdown becomes high. Particularly the IGBT is apt to reach device breakdown due to the latch-up of a parasitic thyristor. Therefore, sure inactivation of the parasitic transistor is essential to provision of an MOS type semiconductor device capable of operating reliably and stably.

In view of the above, it would be desirable to provide a reliable MOS type semiconductor device in which increase in the gain of a parasitic transistor caused by photo pattern defects produced easily in accordance with fineness of a process design rule is suppressed to improve breakdown tolerance.

SUMMARY OF THE INVENTION

The provides a reliable MOS type semiconductor device in which increase in the gain of a parasitic transistor caused by photo pattern defects produced easily in accordance with fineness of a process design rule is suppressed to improve breakdown tolerance.

According to a first aspect of the invention, an MOS type semiconductor device includes: a semiconductor substrate having a first conductivity type low impurity concentration drift layer, second conductivity type base regions and first conductivity type high impurity concentration emitter regions laminated in ascending order on the semiconductor substrate; channel-forming region surfaces provided in a surface of the semiconductor substrate so as to be partially located between a surface of the drift layer and surfaces of the emitter regions; gate electrodes provided on the channel-forming region surfaces through gate insulating films respectively; the emitter regions and the base regions being provided in a principal surface layer of the semiconductor substrate between the channel-forming region surfaces so that the emitter regions are in contact with the channel-forming region surfaces and the base regions are exposed in centers of the principal surface located between the emitter regions; the base regions being separated into island-shaped surface patterns in such a manner that the emitter regions being in contact with both sides of each of the base regions are partially connected to each other to form ladder-shaped surface patterns; and a main electrode being in contact with the island-shaped base regions and the ladder-shaped emitter regions in common so that the island-shaped base regions and the ladder-shaped emitter regions are short-circuited in a surface of the main electrode; wherein partial missing portions are provided in the ladder-shaped surface patterns of the emitter regions so that the island-shaped surface patterns of the base regions exposed in the centers of the principal surface between the channel-forming region surfaces are formed as patterns which are connected along the principal surface and to at least one-side channel-forming region surfaces at portions corresponding to the missing portions so as to reach trenches.

According to a second aspect of the invention, an MOS type semiconductor device according to the first aspect, wherein the rate of reduction in total channel width due to the provision of the missing portions in the ladder-shaped surface patterns of the emitter regions is set to have no influence on transfer characteristic of main current.

According to a third aspect of the invention, there is preferably provided an MOS type semiconductor device according to the second aspect, wherein the width of the missing portions is 5%-40% of the total channel width.

According to a fourth aspect of the invention, there can be provided an MOS type semiconductor device according to the third aspect, wherein the MOS type semiconductor device is an insulated gate bipolar transistor or an insulated gate field effect transistor.

According to a fifth aspect of the invention, there can be provided an MOS type semiconductor device according to the fourth aspect, wherein the MOS structure is a trench gate type or planar gate type MOS structure.

The surface patterns are preferably formed so that region areas as large as possible can be kept in limited regions even when minute patterns are required for forming p⁺ contact regions surrounded by n⁺ source regions (or n⁺ emitter regions) in an insulated gate bipolar transistor or an insulated gate field effect transistor in order to improve performance. Consequently, pattern defects caused by minute patterning in a photolithography process are suppressed to improve breakdown tolerance of the MOS type semiconductor device to thereby make it possible to provide a highly reliable semiconductor device.

Moreover, patterns of the p⁺ contact regions or p base regions are expanded onto the channel-forming regions so that the influence on transfer characteristic of the device is very little, that is, patterns are formed so that missing portions are partially provided in the n⁺ emitter regions. Because the n⁺ emitter regions are regions in which a main current flows, via channels formed in an on-state, there is a possibility that the missing portions may have influence on transfer characteristic to cause reduction in on-voltage when the missing portions are too wide. However, there is substantially no influence on reduction in on-voltage as long as the rate of the width of the missing portions to the total channel width is in a predetermined range.

In view of the above, a highly reliable MOS type semiconductor device is provided which is improved in breakdown tolerance by suppressing an increase in the gain of a parasitic transistor caused by photo pattern defects produced easily in accordance with minute patterning in a process design rule.

Other features, aspects, advantages, embodiments, etc. of the invention will become apparent to those skilled in the art from the following detailed description of the preferred embodiments of the invention and the accompanying drawings.

BRIEF DESCRIPTION OF THE DRAWINGS

The invention will be described with reference to certain preferred embodiments thereof along with the accompanying drawings, wherein:

FIG. 1A is a plan view showing important part of a trench gate structure portion of a trench gate type IGBT according to Embodiment 1 of the invention;

FIG. 1B is a sectional view taken along the line A-A in FIG. 1A;

FIG. 1C is a plan view showing important part of a trench gate structure portion of a trench gate type IGBT according to Embodiment 2 of the invention different in pattern from Embodiment 1;

DETAILED DESCRIPTION OF THE PREFERRED EMBODIMENTS

Figure 2A:
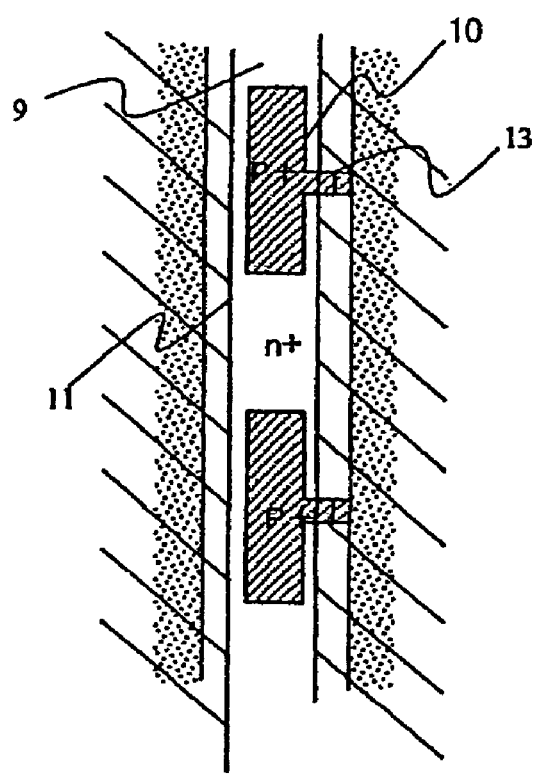
FIG. 2A is a plan view showing important part of a planar gate structure portion of a planar gate type IGBT according to Embodiment 3 of the invention.

FIG. 1A is a plan view showing an important part of a trench gate type MOS structure of a trench gate type IGBT according to a first embodiment of the invention. FIG. 1A shows important part of trenches 5 formed in a surface of a semiconductor substrate, poly-Si patterns (satin-hatched portions) as gate electrodes 7 embedded in the trenches 5 respectively and patterns of n$^+$ emitter regions 9 and important part of patterns of p$^+$ contact regions 10 hatched with slant lines disposed at narrow intervals and interlayer insulating films 11 transparently hatched with slant lines disposed at wide intervals but others are omitted. FIG. 1B is a sectional view taken along the line A-A in FIG. 1A in the case where the others are not omitted. FIG. 1B is like FIG. 3B which is a sectional view taken along the line B-B in FIG. 3A in the background art. FIG. 1C is a plan view showing important part of a trench gate type MOS structure of a trench gate type IGBT according to a second embodiment of the invention.

Figures 3A, 3B, 3C:
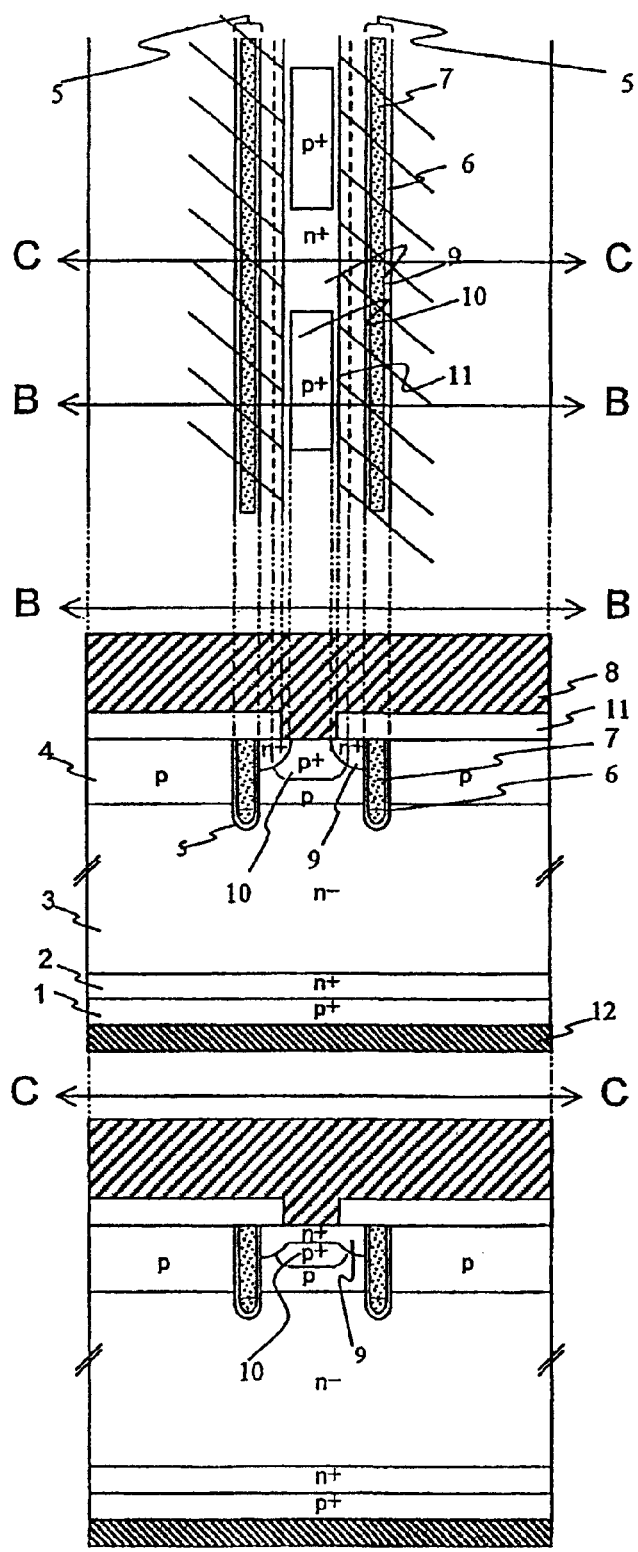
FIG. 3A is a plan view showing important part of a trench gate structure of a trench gate type IGBT according to the background art.
FIG. 3B is a sectional view taken along the line B-B in FIG. 3A.
FIG. 3C is a sectional view taken along the line C-C in FIG. 3A.
Figure 4:
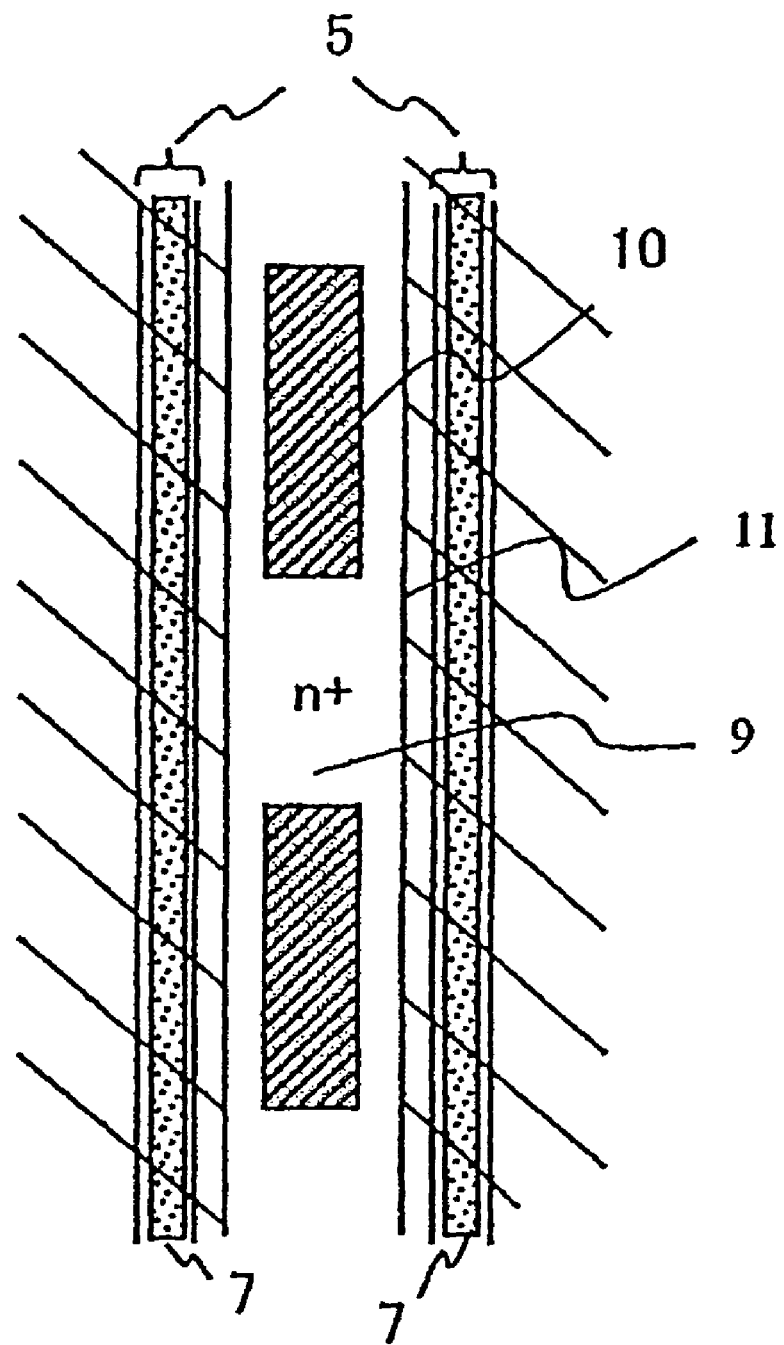
FIG. 4 is a plan view showing important part of the trench gate structure of the trench gate type IGBT according to the background art.

FIG. 4 is a plan view showing poly-Si as the semiconductor substrate and gate electrodes 7 and n$^+$ emitter regions 9 appearing in the semiconductor substrate surface as depicted in the plan view of FIG. 3A according to the background art. In FIG. 4, rectangular region portions hatched with slant lines disposed at narrow intervals are portions on which a resist is placed when the n$^+$ emitter regions are formed so that ion implantation is suppressed to expose p$^+$ contact regions 10 from the surface. When minute patterning advances, trenches are formed at intervals of not longer than 3 µm in the case of the trench gate structure, so that the resist size of the p$^+$ contact regions 10 is inevitably reduced to be not larger than 1 µm in terms of the length of one side. Consequently, if there is any photo process abnormality, the resist in the abnormal portion is apt to be separated to thereby cause pattern abnormality of the p$^+$ contact regions 10.

On the contrary, in first embodiment shown in FIG. 1A and the second embodiment shown in FIG. 1C, surface patterns of regions where the n$^+$ emitter regions 9 are not formed, that is, surface patterns of the p$^+$ contact regions 10 are not simply rectangular as shown in FIG. 4 but polygonal. Accordingly, the area of each pattern is large and the length of each side is large compared with the background art shown in FIG. 4. The first and second embodiments are characterized in that the area of contact between the resist and the semiconductor substrate increases when the n$^+$ emitter regions 9 are formed by a photolithography process. For this reason, the risk that the resist will be separated is reduced even when adhesion between the resist and the semiconductor substrate is lowered due to some abnormality. Consequently, increase in the gain of a parasitic transistor caused by photo pattern defects can be suppressed to improve breakdown tolerance.

In the first and second embodiments, regions where the n$^+$ emitter regions are not formed, that is, missing portions 13 of the n$^+$ emitter region patterns are slightly formed on channel-forming regions (substrate surface side), so that there is no current path formed in the missing portions 13. However, an IGBT or the like may be designed so that each channel is partially inactivated to adjust to a short-circuit current. For example, an IGBT with a high withstand voltage is generally designed so that a main current does not flow in a channel width equal to about 5%-40% of the total channel width. Particularly in an Si IGBT with a high withstand voltage, as the withstand voltage increases, the rate of the resistance component of the channel portion to the total resistance component decreases (e.g. to 10%) and the influence of the missing portions 13 on transfer characteristic decreases. Accordingly, there is no big problem in transfer characteristic such as on-voltage because it can be said that the rate of the width of the missing portions 13 to the total channel width does not change from that in the background art if the rate is in the aforementioned range of 5% to 40% though the rate varies according to design.

The first and second embodiments are different in the form of the patterns of the missing portions 13. In the first embodiment, as shown in FIG. 1A, missing portions 13 of one of n$^+$ emitter regions 9 are provided to extend from a long side of each of rectangular p$^+$ contact regions 10 to the trench 5 so that one missing portion 13 corresponds to one p$^+$ contact region 10. Accordingly, the surface regions of the p$^+$ contact regions 10 are extended by patterns corresponding to the missing portions 13. In the second embodiment, as shown in FIG. 1C, missing portions 13 of n⁺ emitter regions 9 are provided to extend from long sides of each of rectangular p⁺ contact regions 10 to the trenches 5 so that two missing portions 13 correspond to one p⁺ contact region 10, differently from the first embodiment.

Figure 2B:
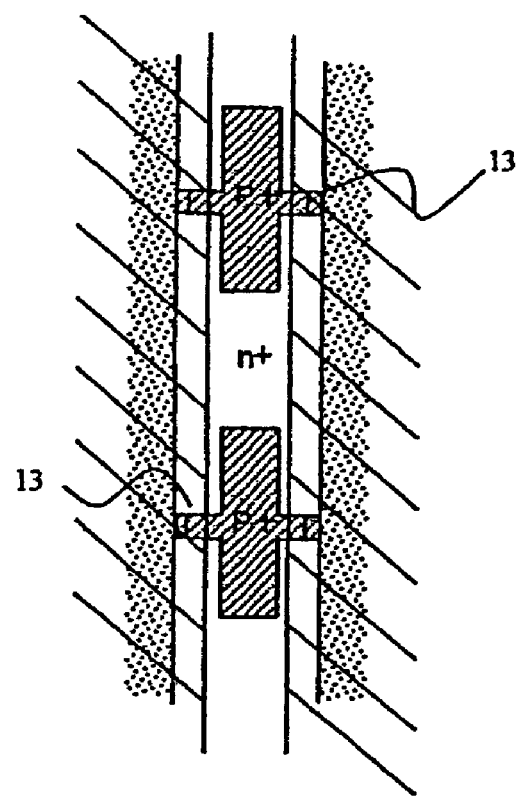
FIG. 2B is a plan view showing important part of a planar gate structure portion of a planar gate type IGBT according to Embodiment 4 of the invention.

FIG. 2A is a plan view showing important part of a planar gate type MOS structure of a planner gate type IGBT according to a third embodiment of the invention. FIG. 2B is a plan view showing important part of a planar gate type MOS structure of a planner gate type IGBT according to a fourth embodiment of the invention. FIG. 2A or 2B is like FIG. 1A or 1B which is a plan view and shows important part of poly-Si as gate electrodes 7 and patterns of n⁺ emitter regions 9 appearing in the semiconductor substrate surface and important part of patterns of p⁺ contact regions 10 hatched with slant lines disposed at narrow intervals and interlayer insulating films 11 transparently hatched with slant lines disposed at wide intervals but others are omitted. A sectional view taken along the line D-D in the case where the others are not omitted is like FIG. 5B which is a sectional view of important part taken along the line E-E in FIG. 5A in the background art.

Figures 5A, 5B, 5C:
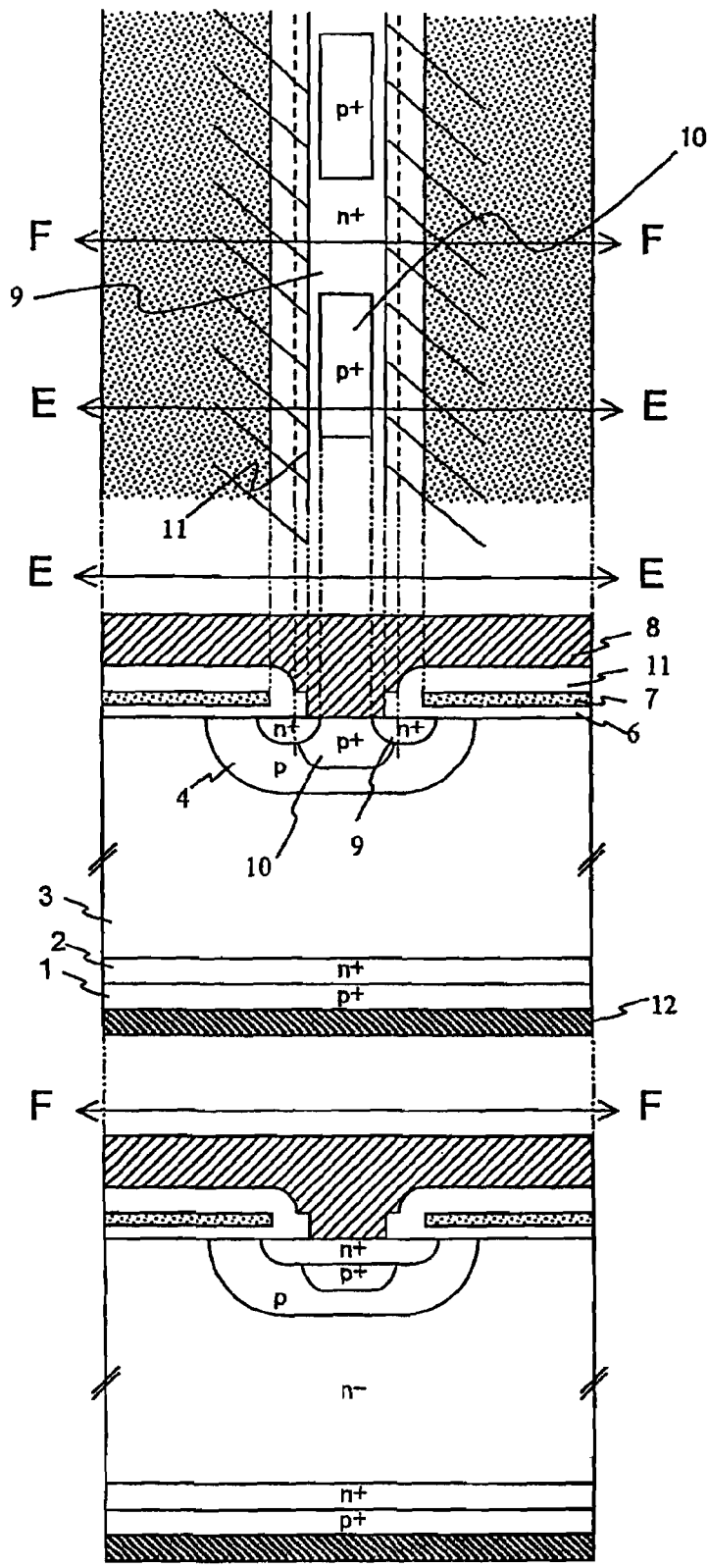
FIG. 5A is a plan view showing important part of a planar gate structure of a planar gate type IGBT according to the background art.
FIG. 5B is a sectional view taken along the line B-B in FIG. 5A.
FIG. 5C is a sectional view taken along the line C-C in FIG. 5A.
Figure 6:
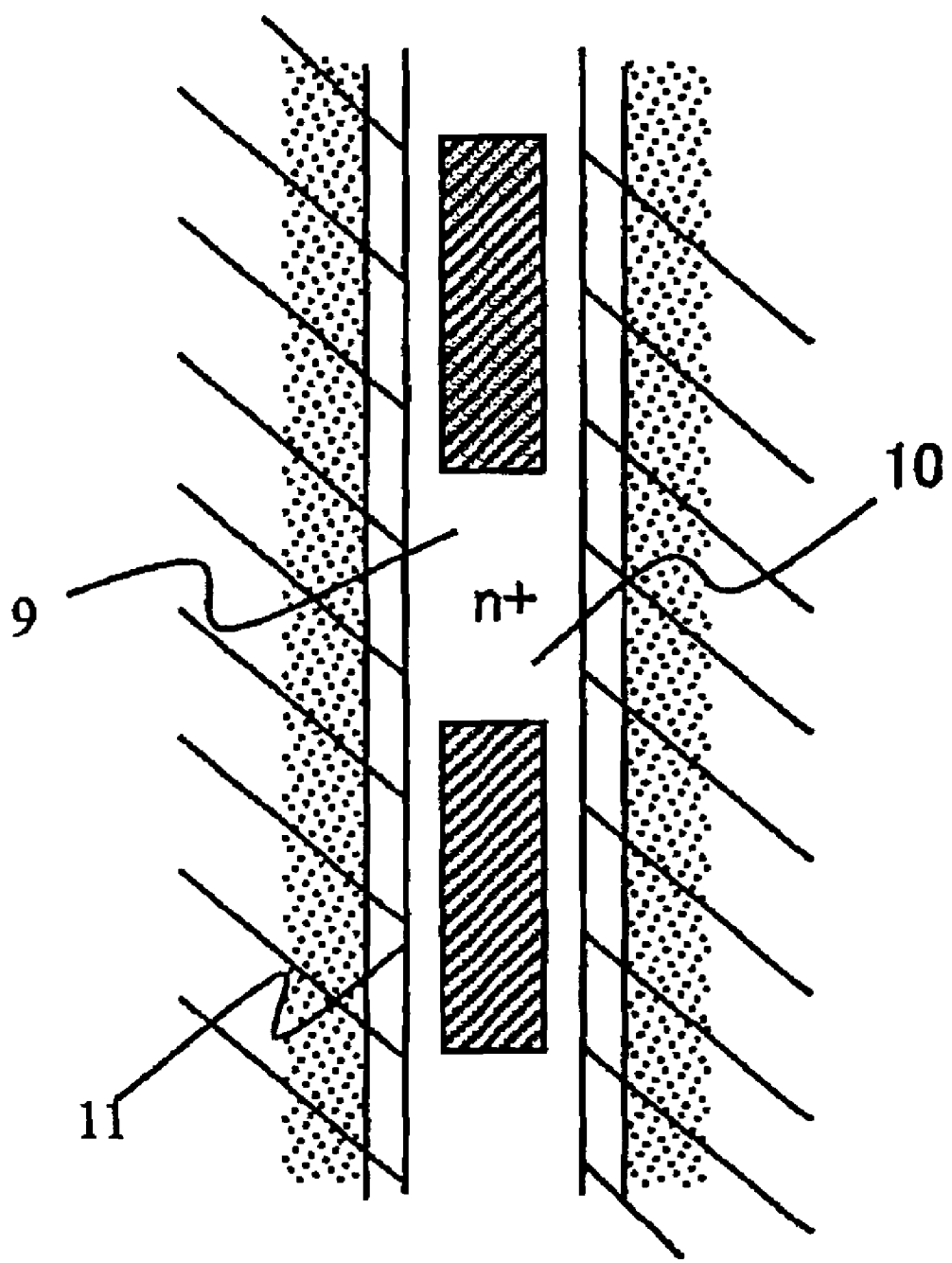
FIG. 6 is a plan view showing important part of the planar gate structure of the planar gate type IGBT according to the background art.

FIG. 6 is a plan view showing poly-Si as the gate electrodes 7 and n⁺ emitter regions 9 and interlayer insulating films 11 appearing in the semiconductor substrate surface as depicted in the plan view of FIG. 5A. In FIG. 6, p⁺ contact regions 10 hatched with slant lines disposed at narrow intervals are rectangular portions on which a resist is placed when n⁺ emitter regions 9 are formed. Similarly to the trench gate structure shown in FIG. 4, when minute patterning advances, openings of the poly-Si gate electrodes 7 are formed at intervals of not longer than 5 µm, so that the resist size of the p⁺ contact regions 10 is inevitably reduced. Accordingly, because the length of one side is reduced, the area of contact between the resist and the semiconductor substrate is reduced. If there is any abnormality, the resist in the abnormal portion is apt to be separated to thereby cause pattern abnormality of the p⁺ contact regions 10.

In contrast, in the third embodiment shown in FIG. 2A and the fourth embodiment shown in FIG. 2B, surface patterns of regions where the n⁺ emitter regions 9 are not formed, that is, surface patterns of the p⁺ contact regions 10 are polygonal. Accordingly, the area of each pattern is large and the length of each side is large compared with the background art. Accordingly, the area of contact between the resist and the semiconductor substrate increases when the n⁺ emitter regions 9 are formed. For this reason, the risk that the resist will be separated is reduced similarly to the case of FIG. 4 even when adhesion between the resist and the semiconductor substrate is lowered due to some abnormality. Consequently, increase in the gain of a parasitic transistor caused by photo pattern defects can be suppressed to improve device destruction tolerance.

In the third and fourth embodiments, missing portions 13 having no n⁺ emitter region are slightly formed on surfaces of channel-forming regions, so that there is no current path formed in the missing portions 13. This is, however, not a major issue for the same reason as described with respect to the first and second embodiments.

The invention has been described with reference to certain preferred embodiments thereof. It will be understood, however, that modifications and variations are possible within the scope of the appended claims.

This application is based on, and claims priority to, Japanese Patent Application No: 2008-147714, filed on Jun. 5, 2008. The disclosure of the priority application, in its entirety, including the drawings, claims, and the specification thereof, is incorporated herein by reference.

What is claimed is:

1. An MOS type semiconductor device comprising:
a semiconductor substrate having a first conductivity type low impurity concentration drift layer, second conductivity type base regions and first conductivity type high impurity concentration emitter regions laminated in ascending order on the semiconductor substrate;
channel-forming region surfaces provided in a surface of the semiconductor substrate so as to be partially located between a surface of the drift layer and surfaces of the emitter regions; and
stripe-like gate electrodes provided on the channel-forming region surfaces through gate insulating films respectively;
wherein the emitter regions and the base regions are provided in a principal surface layer of the semiconductor substrate between the channel-forming region surfaces so that the emitter regions are in contact with the channel-forming region surfaces;
second conductivity type stripe-like contact regions having higher impurity concentration than the base region, the contact regions being spaced from the gate insulting films, and the contact regions are exposed in centers of the principal surface located between the emitter regions;
wherein the contact regions are separated into island-shaped surface patterns in such a manner that the emitter regions in contact with both sides of each of the contact regions are partially connected to each other to form ladder-shaped surface patterns;
wherein a main electrode is in contact with the island-shaped contact regions and the ladder-shaped emitter regions in common so that the island-shaped contact regions and the ladder-shaped emitter regions are short-circuited in a surface of the main electrode; and
wherein partial missing portions are provided in the ladder-shaped surface patterns of the emitter regions so that the island-shaped surface patterns of the contact regions exposed in the centers of the principal surface between the channel-forming region surfaces are formed as patterns which are connected along the principal surface and to at least one-side channel-forming region surfaces at portions corresponding to the missing portions so as to reach the outside of the emitter region.

2. The MOS type semiconductor device according to claim 1, wherein a rate of reduction in total channel width due to the provision of the missing portions in the ladder-shaped surface patterns of the emitter regions is set to have no influence on transfer characteristic of main current.

3. The MOS type semiconductor device according to claim 2, wherein a width of the missing portions is 5%-40% of the total channel width.

4. The MOS type semiconductor device according to claim 3, wherein the MOS type semiconductor device is an insulated gate bipolar transistor.

5. The MOS type semiconductor device according to claim 4, wherein the MOS type semiconductor device is a trench gate type.

6. The MOS type semiconductor device according to claim 4, wherein the MOS type semiconductor device is a planar gate type MOS structure.

7. The MOS type semiconductor device according to claim 3, wherein the MOS type semiconductor device is an insulated gate field effect transistor.

8. The MOS type semiconductor device according to claim 7, wherein the MOS type semiconductor device is a trench gate type.

9. The MOS type semiconductor device according to claim 7, wherein the MOS type semiconductor device is a planar gate type MOS structure.

10. The MOS type semiconductor device according to claim 5, wherein the width between the trenches is 3 μm or less.

11. The MOS type semiconductor device according to claim 8, wherein the width between the trenches is 3 μm or less.

* * * * *